US008754320B2

(12) United States Patent
Mantese

(10) Patent No.: US 8,754,320 B2
(45) Date of Patent: Jun. 17, 2014

(54) COMPOSITE MATERIALS WITH ANISOTROPIC ELECTRICAL AND THERMAL CONDUCTIVITIES

(75) Inventor: Joseph V. Mantese, Manchester, CT (US)

(73) Assignee: United Technologies Corporation, Hartford, CT (US)

( * ) Notice: Subject to any disclaimer, the term of this patent is extended or adjusted under 35 U.S.C. 154(b) by 258 days.

(21) Appl. No.: 12/193,805

(22) Filed: Aug. 19, 2008

(65) Prior Publication Data

US 2010/0044644 A1 Feb. 25, 2010

(51) Int. Cl.
H01L 35/14 (2006.01)

(52) U.S. Cl.
USPC .......... 136/236.1; 136/200; 136/238; 136/239

(58) Field of Classification Search
CPC ......... H01L 35/32; H01L 35/16; H01L 35/22; H01L 35/24; H01L 35/20; H01L 35/14; H01L 29/15
USPC ............................... 136/200, 236.1, 238, 239
See application file for complete search history.

(56) References Cited

U.S. PATENT DOCUMENTS

| 5,313,484 | A | | 5/1994 | Arimoto |
| 5,610,366 | A | * | 3/1997 | Fleurial et al. ................. 136/202 |
| 6,225,550 | B1 | * | 5/2001 | Hornbostel et al. ....... 136/236.1 |
| 6,369,314 | B1 | | 4/2002 | Nolas |
| 6,444,896 | B1 | * | 9/2002 | Harman et al. ................ 136/239 |
| 6,605,772 | B2 | | 8/2003 | Harman et al. |
| 7,342,169 | B2 | | 3/2008 | Venkatasubramanian et al. |
| 7,365,265 | B2 | | 4/2008 | Heremans et al. |
| 2004/0187905 | A1 | | 9/2004 | Heremans et al. |
| 2005/0241689 | A1 | | 11/2005 | Chen et al. |
| 2005/0284512 | A1 | * | 12/2005 | Heremans et al. ......... 136/236.1 |
| 2006/0102224 | A1 | * | 5/2006 | Chen et al. .................... 136/203 |
| 2008/0178920 | A1 | | 7/2008 | Ullo |

FOREIGN PATENT DOCUMENTS

| JP | 07 147392 A | 6/1995 |
| JP | 10 329606 A | 12/1998 |

OTHER PUBLICATIONS

I. F. Voloshin et al.: "The Asymmetric Heat Conduction of Semiconductor Rectifiers," 1968, Journal of Engineering Physics, Inzhenerno-Fizicheskii Zhurnal, vol. 14, No. 2, pp. 338-342.
A. M. Song et al.: "Nonlinear Electron Transport in an Asymmetric Microjunction: A Ballistic Rectifier," Apr. 27, 1998, The American Physical Society, vol. 80, No. 17, pp. 3831-3834.
M. Peyrard: "The design of a thermal rectifier," published online Aug. 25, 2006, Europhysics Letters (Published by EDP Sciences and available at http://www.edpsciences.org/epl or http://dx.doi.org/10.1209/epl/i2006-10223-5), pp. 1-7.
C. W. Chang et al.; "Solid-State Thermal Recitfier," Nov. 17, 2006, Science (www.sciencemag.org), vol. 314, pp. 1121-1124.
Alvarez-Quintata, J. et al. "Cross-plane thermal conductivity reduction of vertically uncorrelated Ge/Si quantum dot superlattices." Applied Physics Letters. 93. 013112. 2008.
The extended European Search Report of counterpart European Application No. 09252023.8 filed Aug. 12, 2009.

\* cited by examiner

*Primary Examiner* — Mark Kopec
*Assistant Examiner* — Haidung Nguyen
(74) *Attorney, Agent, or Firm* — Kinney & Lange, P.A.

(57) ABSTRACT

A composite material with tailored anisotropic electrical and thermal conductivities is described. A material consists of a matrix material containing inclusions with anisotropic geometrical shapes. The inclusions are arranged in layers oriented perpendicular to the principal direction of electrical and thermal energy flow in the material. The shapes of the inclusions are such that they represent strong or weak barriers to energy flow depending on whether the major axis of the inclusions are parallel to or antiparallel to the flow direction.

9 Claims, 4 Drawing Sheets

COMPOSITE MATERIALS WITH ANISOTROPIC ELECTRICAL AND THERMAL CONDUCTIVITIES

BACKGROUND

This invention relates to composite materials containing inclusions with anisotropic geometrical shapes in general and, more particularly, to composite materials with tailored anisotropic electrical and thermal conductivities.

The ability to control the direction and magnitude of energy flow in one dimension (wire), two dimension (thin film), and three dimension (bulk) solid state components has been considered critical to device performance since the beginning of the electronic age. Diodes and other electronic valves are principal examples. Another example where directionality of thermal and electrical currents affect performance is in thermoelectric devices. The dimensionless thermoelectric figure of merit is a measure of performance and is given by the following equation:

$$ZT = \frac{S^2 \sigma T}{K},$$

where S, σ, K and T are the Seebeck coefficient, electrical conductivity, thermal conductivity and absolute temperature respectively.

The thermoelectric figure of merit is also related to the strength of interaction between the carriers and vibrational modes of the lattice structure (phonons) and available carrier energy states which, in turn, are a function of the materials used in the thermoelectric component. As such, the thermal conductivity, K, has an electronic component ($K_E$), associated with the electronic carriers and a lattice component ($K_L$) associated with thermal energy flow due to phonons. The thermal conductivity can then be expressed as $K=K_E+K_L$, and the figure of merit can be expressed generally as $$ZT = \frac{S^2 \sigma T}{K_E + K_L}.$$

Efforts to improve the performance of thermoelectric materials have generally focused on reducing K and maximizing σ. Unfortunately, the two quantities are closely coupled, and changing one typically results in corresponding changes in the other.

Recent efforts to improve thermoelectric performance without sacrificing electrical conductivity have focused on inserting physical obstacles with nano scaled dimensions in thermoelectric structures to presumably impede phonon propagation. Venkata Subramanian et al. U.S. Pat. No. 7,342,169 teach that superlattice structures with nano scale dimensions block phonon transmission while allowing electron transmission thereby raising ZT and is included herein in its entirety for reference. Harmon et al. U.S. Pat. No. 6,605,772 disclose that quantum dot superlattices (QDSL) of thermoelectric materials exhibit enhanced ZT values at room temperature also by blocking phonon transmission and is included in its entirety for reference. Heremans et al. U.S. Pat. No. 7,365,265 and U.S. Publication No. 2004/0187905 disclose that nano scale inclusions on the order of 100 nm in size presumably block phonon transmission in lead telluride (PbTe) and other thermoelectric materials, thereby significantly improving the Seebeck coefficient.

Other physical obstacles to energy flow in solids have been disclosed that affect K. Song et al., Physical Review Letters, Vol. 80, 3831 (1998), demonstrate that an asymmetric artificial scatterer in a semiconductor microjunction deflects ballistic electrons causing nonlinear transport and current voltage (IV) rectification and is included herein in its entirety for reference.

Asymmetric energy flow in materials is a useful property with a multitude of applications not limited to thermoelectric materials.

SUMMARY

In accordance with this invention, a material has a microstructure comprising of a matrix and inclusions dispersed in the matrix. The inclusions are characterized by having an anisotropic geometrical shape such that they interact with energy carriers in the matrix in an anisotropic manner, depending on how the major axes of the inclusions are oriented with respect to the principal directions of energy flow. The energy carriers are comprised of electrical energy carriers such as electrons and holes and thermal energy carriers such as phonons. By orienting the inclusions in different directions with respect to the principal directions of energy flow, anisotropic thermal and electrical conductivity can be achieved.

In one aspect of this invention, the matrix material can be an electrical conductor, a semiconductor, or an insulator. The inclusions with anisotropic geometrical shapes can be electrical conductors, semiconductors, or insulators.

In another aspect of this invention, the matrix is a thermoelectric material and the composite material has a high thermoelectric figure of merit ZT.

In another aspect of this invention, the inclusions with anisotropic geometrical shapes are arranged in single or multiple layers oriented perpendicular to the principal direction of energy flow in the material.

In another aspect of this invention, the inclusions have nano dimensions on the order of 10 nanometers to 5 microns.

In another aspect of this invention, the inclusions are geometrical quantum dots.

DETAILED DESCRIPTION

The present invention is generally directed to a method of imparting anisotropic thermal and electrical conductivity in a composite material consisting of a matrix material and inclusions with anisotropic geometrical shapes. The anisotropic energy flow is directly related to the orientation of the principal axes of the inclusions with respect to the principal direction of energy flow.

Figure 1:
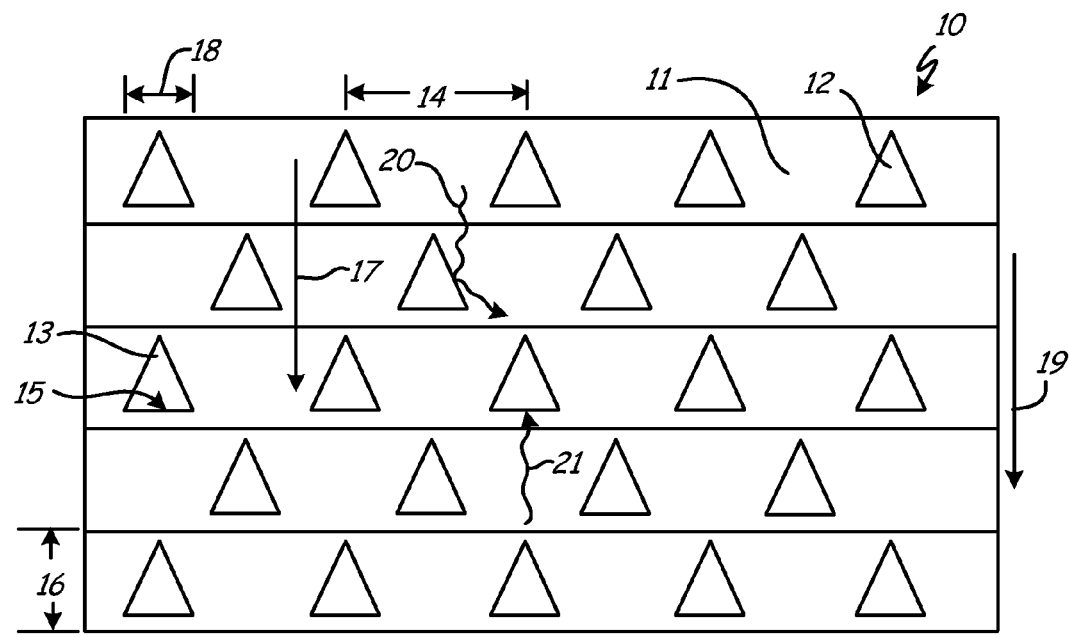
FIG. 1 is a schematic showing the cross-sectional shape of conical inclusions in a material.

Geometrical aspects of the relation between inclusions with anisotropic geometrical shapes and energy flow are illustrated in the embodiment shown in FIG. 1, which is a schematic drawing showing a cross-section of material 10. Material 10 includes matrix material 11 containing conical inclusions 12 which have an apex 13 and a base 15. Base 15 is wider than apex 13, thereby imparting asymmetric geometry to the inclusion. In the example, energy flow is depicted as arrow 17 in the principal direction of the flow. Arrow 19 depicts driving force for energy flow 17 and determines direction of energy flow 17. Driving force 19 comprises, for instance, an electrical potential if energy flow 17 is electrical energy and, for instance, a temperature gradient if energy flow 17 is thermal energy. Matrix material 11 and inclusions 12 can be electrical conductors, semiconductors, or insulators. Electrical energy propagates through both matrix 11 and inclusions 12 in the form of electrons and holes, and thermal energy propagates in the form of elastic waves as phonons. Schematic wavy arrow 20 depicts deflections of energy carriers in energy flow 17 due to shaped sides of inclusions 12 as the energy carriers encounter inclusions 12.

If the elastic properties of inclusion 12 and material 10 are sufficiently different, for instance, inclusion 12 will deflect energy flow due to phonons as a result of a difference in acoustic impedance at the inclusion 12 material 10 interface.

If the driving force for energy flow 19 is reversed, the energy carriers encounter obstacles (inclusions 12) where deflection is not possible, and barriers to energy flow are higher. This is schematically illustrated by wavy arrow 21. Thus, the rate of energy flow in the direction of arrow 17 is higher than in the opposite direction if driving force 19 and subsequent energy flow 17 were reversed due to the anisotropic obstacle strength of the asymmetric obstacles.

In the embodiment shown in FIG. 1, inclusions 12 are in parallel arrays stacked on top one another at spacing 16. Inclusions 12 are spaced apart at distance 14 in each layer in an arrangement where obstacle width 18 is sufficiently less than spacing 14, such that there is a finite aerial density of unobstructed line of sight path through composite material 10, such that some energy carriers 20 in energy flow 17 can pass through material 10 unimpeded without encountering an obstacle.

Figure 2:
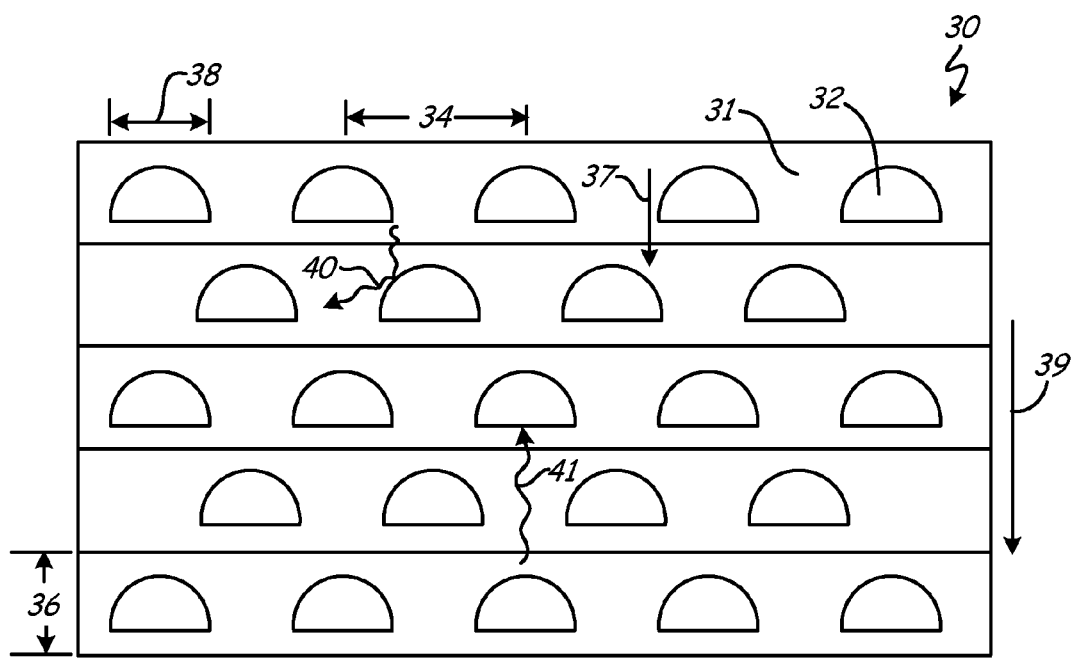
FIG. 2 is a schematic showing the cross-sectional shape of hemispherical inclusions in a material.

In another embodiment of the invention shown in FIG. 2, material 30 includes matrix material 31 containing hemispherical inclusions 32. Driving force 39 comprises, for instance, an electrical potential for electrical energy flow 37 or, for instance, a temperature gradient, if energy flow 37 is thermal energy or both. Matrix material 31 and inclusions 32 can be electrical conductors, semiconductors, or insulators.

In the embodiment shown in FIG. 2, schematic wavy arrow 40 depicts deflections of energy carriers of energy flow 37 due to shaped sides of inclusions 32 as they encounter inclusions 32. Inclusions 32 are in parallel arrays stacked on top of one another at spacing 36. Inclusions 32 are spaced apart at distance 34 in each layer in an arrangement where obstacle width 38 is sufficiently large compared to spacing 34 such that there is no aerial density where energy flow 37 can migrate through material 30 without encountering an obstacle in a line of sight path. On the other hand, energy deflection as indicated by wavy arrow 40 still has a vector component in the downward direction after impacting an obstacle allowing energy flow.

If the driving force for energy flow 39 is reversed, the energy carriers encounter obstacles where deflection is not possible and the barriers to energy flow are higher. This is schematically illustrated by wavy arrow 41. Thus, the rate of energy flow in the direction of arrow 39 is higher than in the opposite direction if driving force 39 and subsequent energy flow 37 were reversed due to the anisotropic obstacle strength of the asymmetric inclusions.

In other embodiments of the invention, the inclusions with anisotropic geometrical shapes can be pyramids, oblate spheroids or other shapes wherein the base cross-sectional area is larger than the peak cross-sectional area along a principal axis of the inclusion in the direction of energy flow.

To be effective as anisotropic barriers of electrical and thermal energy propagation, the barrier size and spacing need to be commensurate with the wavelength and mean free path of the carriers (i.e. electrons, holes, phonons) themselves. These quantities all have submicron dimensions.

In one embodiment, for example, a superlattice structure is formed atom layer by atom layer by physical vapor deposition (PVD) methods such as molecular beam epitaxy (MBE) and others known to those in the art. The superlattice structure can be formed so that it contains nanoscale obstacles with three-dimensional anisotropic geometrical symmetry. Superlattice structures are formed by depositing alternating layers of different materials on an atom layer by atom layer basis. Under conditions where the two materials have similar crystal structures but exhibit lattice mismatch, individual three-dimensional structures or "islands" will self form in layers on the substrate to minimize strain energy during deposition. In systems where both materials are semiconductors, the particles can be quantum dots containing quantized electrons with zero dimensions. Quantum dot superlattice (QDSL) structures have enhanced thermoelectric properties over the bulk materials.

In this embodiment, quantum dots with geometrical anisotropic shapes such as those shown in FIGS. 1 and 2 are oriented such that the layers in the superlattice are perpendicular to the principal direction of electrical and thermal energy flow in the superlattice. The resulting anisotropic energy flow will raise ZT, the thermoelectric figure of merit. Thermal flow in the reverse direction will be discouraged by the shape of the obstacles. The semiconducting obstacles will allow electron flow and will impede phonon propagation due to impedance mismatch at the coherent quantum dot obstacle matrix boundaries, thereby increasing ZT by decreasing $K_L$.

In another embodiment, microstructures containing layers of particles with anisotropic geometric shapes are formed by PVD and accompanying photolithographic techniques wherein multimasking and angle etching steps form "islands" of a second material in a first material. Planarizing each layer containing the islands by depositing a layer of the first material to the top of the islands of the second material form inclusions of the second material in a layer of the first material. This process is repeated until the required dimensions are formed.

Figure 3A:
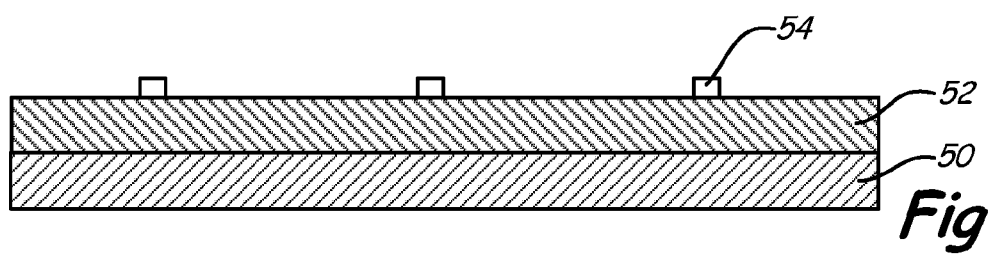
FIGS. 3A and 3B are schematics showing the initial steps in creating a layer of anisotropic geometric inclusions in multilayer thin films.
Figure 3B:
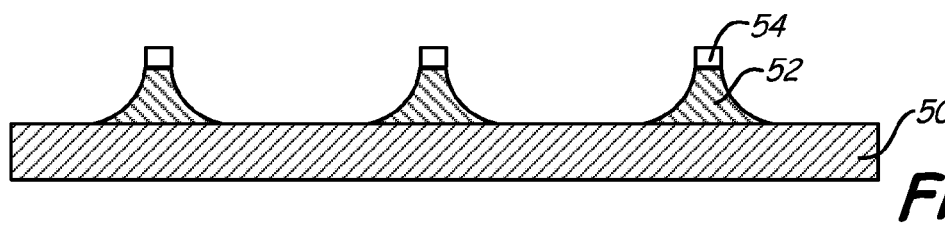

This process is schematically illustrated in FIGS. 3A, 3B, 4A, 4B, 5A, and 5B. FIG. 3A shows a structure in which layer 52 of Material B is deposited on substrate 50 of Material A. Mask pattern 54 is deposited on layer 52 and formed by liftoff and other techniques known to those in the art. The structure is then exposed to, for instance, a wet chemical etch to remove the portions of layer 52 not covered by a mask. The etched structure is shown FIG. 3B wherein the cross-sectional shape of the material in layer 52 under mask 54 has distinctly curved sides due to the nature of chemical activity during wet etching.

Figure 4A:
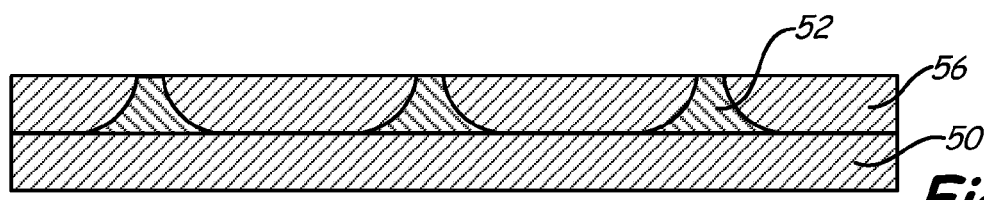
FIGS. 4A and 4B are schematics showing the steps to create a second layer of anisotropic geometric inclusions in multilayer thin films.
Figure 4B:
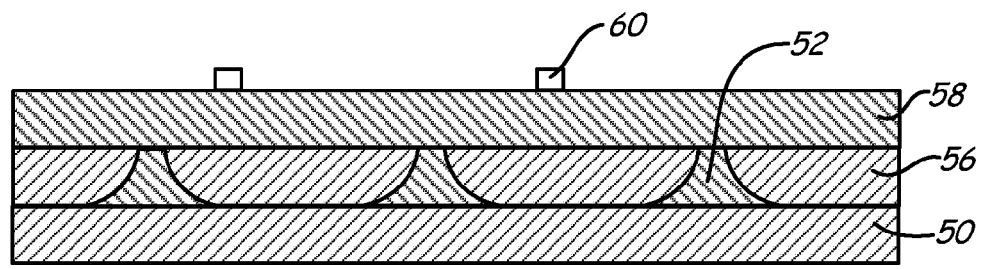

The next step is shown in FIG. 4A in which the structure is planarized by depositing Material A to form layer 56 after removing mask 54. As shown in FIG. 4B, the process is then repeated by depositing Material B in layer 58 on layer 56 containing "islands" 52 of Material B.

Figure 5A:
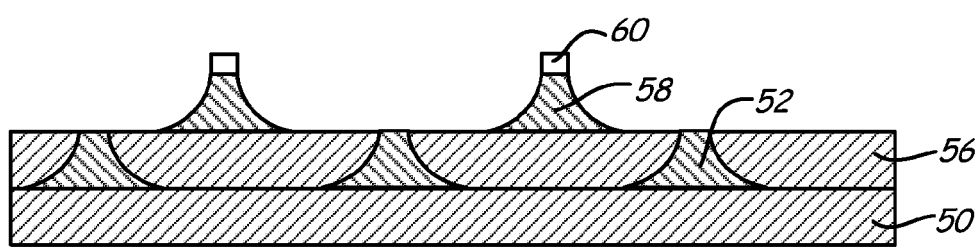
FIGS. 5A and 5B are schematics showing the final steps to create two layers of anisotropic geometric inclusions in multilayer thin films.
Figure 5B:
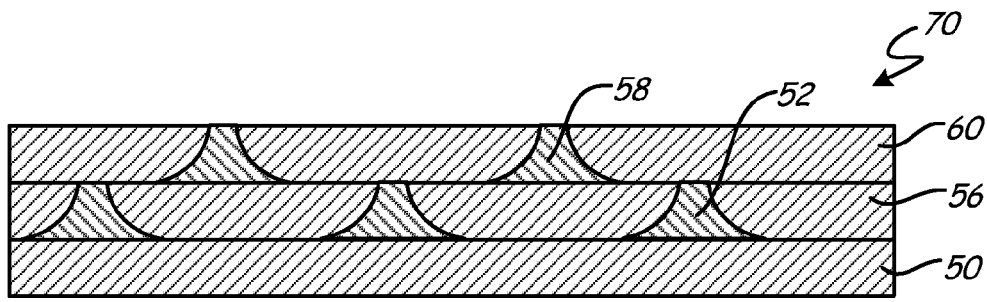

Mask pattern 60 is then deposited on layer 58 and exposed to an etch and to produce the structure shown in FIG. 5A. In FIG. 5A, the portion of Material B not under mask 60 has been removed to reveal islands 58 with curved sides. The structure is then planarized after removal of mask 60 by depositing a layer of Material A on layer 56 containing islands 58 to produce structure 70 shown in FIG. 5B. The process can be repeated at will to produce composite structure 70 containing Material B inclusions 52, 58 etc. with anisotropic geometrical shapes in Material A matrix 50, 56, 60 etc. Inclusions 52, 58 etc. can have square, triangular, circular, or other cross-sections with respect to a plane parallel to layers. Cross-sectional shape of particles 52, 58 etc. with respect to a plane perpendicular to the layers as shown in, for instance, FIG. 5B can be formed by means other than wet etching such as ion beam techniques and others known to those in the art. Materials A and B can be at least one of electrical insulators, semiconductors, or conductors. Structure 70 shown schematically in FIG. 5B can be formed by physical vapor deposition techniques such as ion beam deposition (IBD), electron beam deposition (EBD), molecular beam epitaxy (MBE) and others known to those in the art.

Although the present invention has been described with reference to preferred embodiments, workers skilled in the art will recognize that changes may be made in form and detail without departing from the spirit and scope of the invention.

The invention claimed is:

1. A device comprising a composite material that comprises
   a matrix material; and
   ordered planar arrays of inclusions oriented perpendicular to a principal direction of thermal and electrical energy flow in the matrix material with similar or identical anisotropic geometrical shapes with base dimensions and apex dimensions dispersed in the matrix material that, depending on orientation of the inclusions with respect to a principal direction of electrical and thermal energy flow in the material, will strongly or weakly interact with electrical and/or thermal carriers, wherein said device is configured to result in anisotropic electrical and thermal conductivity.

2. The device of claim 1, wherein the matrix is an electrical conductor, semiconductor or insulator.

3. The device of claim 1, wherein the inclusions are electrical conductors, semiconductors or insulators.

4. The device of claim 1, wherein the matrix is a thermoelectric material and the composite material has a ZT figure of merit greater than one at room temperature.

5. The device of claim 1, wherein the spacing of the ordered planar arrays of inclusions with anisotropic geometrical shapes is on the order of a mean free path of the charge carriers in the energy flow.

6. The device of claim 1, wherein the inclusions with anisotropic geometrical shapes are cones, pyramids, oblate spheroids or other shapes wherein a base cross-sectional area is larger than a peak cross-sectional area along a principal axis of the inclusion in the direction of energy flow.

7. The device of claim 6, wherein the major dimensions of the inclusions are in a range from about 10 nanometers to about 5 microns.

8. The device of claim 1, wherein the composite material is formed by at least one of molecular beam epitaxy, metal organic chemical vapor deposition, physical vapor deposition, ion beam deposition and chemical vapor deposition.

9. The device of claim 6, wherein an acoustical impedance difference across the inclusion boundaries is sufficient to deflect or impede phonon propagation.

* * * * *